(12) United States Patent
Akiyama et al.

(10) Patent No.: US 8,568,955 B2
(45) Date of Patent: Oct. 29, 2013

(54) COMPOSITION FOR FORMATION OF TOP ANTIREFLECTIVE FILM, AND PATTERN FORMATION METHOD USING THE COMPOSITION

(75) Inventors: Yasushi Akiyama, Kakegawa (JP); Go Noya, Kakegawa (JP); Katsutoshi Kuramoto, Kawaguchi (JP); Yusuke Takano, Kakegawa (JP)

(73) Assignee: Electronic Materials USA Corp., Somerville, NJ (US)

( * ) Notice: Subject to any disclaimer, the term of this patent is extended or adjusted under 35 U.S.C. 154(b) by 351 days.

(21) Appl. No.: 12/747,652

(22) PCT Filed: Dec. 10, 2008

(86) PCT No.: PCT/JP2008/072432
§ 371 (c)(1),
(2), (4) Date: Jun. 11, 2010

(87) PCT Pub. No.: WO2009/078322
PCT Pub. Date: Jun. 25, 2009

(65) Prior Publication Data
US 2010/0286318 A1    Nov. 11, 2010

(30) Foreign Application Priority Data

Dec. 14, 2007  (JP) ................................. 2007-323198

(51) Int. Cl.
*G11B 7/24*      (2013.01)
*C04B 24/22*     (2006.01)

(52) U.S. Cl.
USPC ................ 430/270.1; 430/273.1; 430/325; 524/247

(58) Field of Classification Search
USPC ................ 430/270.1, 273.1, 325; 524/247
See application file for complete search history.

(56) References Cited

U.S. PATENT DOCUMENTS

| | | | |
|---|---|---|---|
| 5,118,585 A | 6/1992 | Schwalm et al. | |
| 5,468,589 A | 11/1995 | Urano et al. | |
| 5,541,037 A | 7/1996 | Hatakeyama et al. | |
| 6,692,892 B1 | 2/2004 | Takano et al. | |
| 2003/0219682 A1 | 11/2003 | Wakiya et al. | |
| 2005/0239932 A1 | 10/2005 | Akiyama et al. | |

FOREIGN PATENT DOCUMENTS

| | | |
|---|---|---|
| EP | 0 366 590 B1 | 3/1996 |
| EP | 0 388 343 B1 | 7/1996 |
| JP | 2-19847 A | 1/1990 |
| JP | 2-209977 A | 8/1990 |
| JP | 3-206458 A | 9/1991 |
| JP | 4-211258 A | 8/1992 |
| JP | 5-249682 A | 9/1993 |
| JP | 7-295210 A | 11/1995 |
| JP | 8-44066 A | 2/1996 |
| JP | 7-181685 A | 7/1996 |
| JP | 8-305032 A | 11/1996 |
| JP | 2001-142221 A | 5/2001 |
| JP | 2003-345026 A | 12/2003 |
| JP | 2004-37887 A | 2/2004 |
| JP | 2005-157259 A | 6/2005 |

OTHER PUBLICATIONS

English Language Abstract from JPO of JP 4-211258 A.

*Primary Examiner* — Peter D Mulcahy
(74) *Attorney, Agent, or Firm* — Sangya Jain

(57) ABSTRACT

Disclosed is a composition for forming a top antireflective film, which comprises at least one fluorine-containing compound and a quaternary ammonium compound represented by the formula (1) [wherein at least one of $R^1$, $R^2$, $R^3$, and $R^4$ represents a hydroxyl group or an alkanol group, and the others independently represent a hydrogen or an alkyl group having 1 to 10 carbon atoms; and $X^-$ represents a hydroxyl group, a halide ion or a sulfate ion], and optionally a water-soluble polymer, an acid, a surfactant and an aqueous solvent. The composition for forming a top antireflective film can exhibit the same levels of functions as those of conventional top antireflective film-forming compositions when applied in a smaller amount.

[General formula (1)]

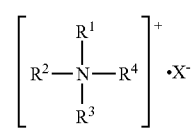

8 Claims, No Drawings

COMPOSITION FOR FORMATION OF TOP ANTIREFLECTIVE FILM, AND PATTERN FORMATION METHOD USING THE COMPOSITION

This application is a United States National Stage Patent Application under 35 U.S.C. §371 of International Patent Application No. PCT/JP2008/072432, filed Dec. 10, 2008, which claims priority to Japanese Patent Application No. 2007-323198, filed Dec. 14, 2007, the contents of both documents being hereby incorporated herein by reference.

TECHNICAL FIELD

The present invention relates to a composition for forming a top antireflective film. More specifically, the invention relates to a composition for forming a top antireflective film, which is used for forming an interference preventive layer on a photoresist film for inhibiting a lowering of a pattern dimensional accuracy (that is, inhibiting the change of the pattern dimensional width) owing to the interference between the incident light or the reflective light from an inner surface of a photoresist film and the reflective light from a substrate in the photoresist film when a resist pattern is formed according to a photolithographic technology with a photoresist. The present invention, further, relates to a method for forming a pattern using such a composition for forming a top antireflective film.

BACKGROUND ART

On production of semiconductor devices, adopted is a lithographic technology where a photoresist layer is formed on a substrate such as a silicon wafer, selectively irradiated with an actinic ray and developed to form a resist pattern on the substrate.

In recent years, miniaturization of a processing line width in a lithographic process is rapidly forwarded in order to obtain a higher integration in LSIs. When the miniaturization of a processing line width has been forwarded, various proposals were made on all processes and materials used in the lithography, which included a photoresist, an antireflective film, an exposure method, an exposure device, a developing agent, a developing method, a developing device and the like. For example, concerning a top antireflective film, it is known to form a top antireflective film by applying a composition containing a fluorine-containing compound such as a fluorinated compound, for example perfluorooctanoic acid, perfluorooctanesulfonic acid or the like, or a fluoropolymer on a resist film to form a top antireflective film. When the top antireflective film is disposed on a resist layer, there is an advantage that the width of amplitude based on a resist film thickness vs. sensitivity curve becomes smaller and even when a film thickness of a resist layer fluctuates, the fluctuation in sensitivity comes to be smaller and small fluctuation in the dimension is obtained. Further, when a top antireflective film is used, there is another advantage that a standing wave due to interference between the incident light and the reflective light or between reflective lights can be reduced.

Concerning the exposure device, there has been proposed processes using light sources irradiating a short wavelength light which is effective in high miniaturization, that is, processes using light sources irradiating far ultraviolet rays such as a KrF excimer laser (248 nm) and an ArF excimer laser (193 nm), X-rays and electron beams as an exposure light source and the process is putting into partial practical use. In such a lithographic process where a short wavelength light source is used as a light source, a process using a chemically amplified resist which is highly sensitive to a short wavelength energy ray have been proposed (JP-A Nos. 2-209977, 2-19847, 3-206458, 4-211258 and 5-249682).

On the other hand, it is known that a compound containing a fluorine atom exhibits a low refractive index owing to a large molar volume and small atomic refraction of the fluorine atom and the value of the refractive index of the compound are substantially directly proportional to fluorine content in the compound. The fluorosurfactant mentioned above such as perfluorooctanoic acid and perfluorooctanesulfonic acid have a low refractive index and can be developed with an aqueous solvent. The fluorosurfactant, therefore, is a preferable compound on making an antireflection property shown. When the fluorosurfactant is not used, a refractive index of the coated film increases and thereby a standing wave effect and a multiplex reflection effect cannot be sufficiently suppressed. As a result, the dimensional accuracy of the resist pattern is deteriorated.

However, the fluorinated compounds have problems in degradability and an accumulation property in a human body. In addition, these compounds have been also specified in Japan in 2002 as a second surveillance compound by "Law Concerning Examination and Regulation of Manufacture and Handling of Chemical Substances". Accordingly, a composition for an antireflective coating that uses a fluoropolymer was proposed in return for the fluorinated compounds (JP-A No. 2004-037887). A composition for forming an antireflective film, which uses the fluoropolymer described in the JP-A No. 2004-037887, is not at all bear comparison with an existing material in an application property. Therefore, by using the composition, an antireflective film can be formed using the same coating method and the same coating device as ever.

However, it has been desired in recent semiconductor industries to reduce the application amounts of various kinds of coating solutions and reduce the amounts of waste liquids by the reduced amount of the coating solution on application in order to make influences to the environment as small as possible. That is, as the fluorinated compound has problems in health and environment from the reasons of the low degradability and the accumulation property in a human body, the reduction of an amount of a coating solution containing the fluorinated compound on application is strongly desired when the top antireflective film is formed. Further, even when a fluoropolymer chemical material free from such problems is used, it is hoped to reduce the amount of waste liquid by the reduced dispense volume from the viewpoints of the conservation of environment and the cost.

On the other hand, it has been known to use a quaternary ammonium hydroxide as a material for an antireflective film. As an example where the quaternary ammonium hydroxide is used as a material of an antireflective film, it is cited to use a quaternary ammonium compound having a low refractive index as a material of an antireflective film (see JP-A No. 7-295210). However, in JP-A No. 7-295210, there is no description of using a quaternary ammonium hydroxide together with a fluorine-containing compound and realizing thereby a reduction in a dispense volume of a composition for forming a top antireflective film containing a fluorine-containing compound as a material having a low refractive index. Further, a top antireflective film composition which uses a quaternary ammonium compound as a low refractive index material has a problem in performance of an antireflective film for an ArF excimer laser or a KrF excimer laser. In still another example, as a material used in an antireflective film, it has been proposed to use a nitrogen-containing compound such as a quaternary ammonium hydroxide as an additive in a material for forming a layer on a resist film, which comprises a carbonized fluorinated compound free from problems of degradability and an accumulation property in a human body (JP-A No. 2005-157259). JP-A No. 2005-157259 discloses a tetraalkylammonium hydroxide and choline as the quaternary ammonium hydroxide. However, in JP-A No. 2005-157259, there is neither description of a specific example that uses the quaternary ammonium hydroxide including choline nor description of capability of realizing a reduction in dispense volume of a coating solution owing to usage of choline. Furthermore, the JP-A No. 2004-037887 discloses to add an amine such as a quaternary ammonium hydroxide to a coating composition for an antireflective film, which contains a fluoropolymer, but it does not disclose a quaternary ammonium hydroxide containing a hydroxyl group or an alkanol group as a substituent of nitrogen.

DISCLOSURE OF THE INVENTION

Problems to be Solved by the Invention

The present invention was devised in view of above-mentioned situations and an object of the invention is to provide a composition for forming a top antireflective film containing a fluorine-containing compound as a low refractive index material, wherein an amount of the composition applied can be reduced when a top antireflective film is formed. More specifically, an object of the invention is to provide a composition for forming a top antireflective film that uses a low refractive index fluorine-containing compound with a low refractive index, which can exhibit, in spite of a smaller dispense volume in comparison with so far known compositions for forming a top antireflective film containing a fluorine-containing compound, the same levels of functions as those of conventional type top antireflective film-forming compositions, that is, can form a resist pattern free from deterioration in pattern dimensional accuracy (that is, free from variation of a pattern dimensional width) caused by the interference between the reflective light from a substrate and the incident light or the reflective light from an inner surface of a photoresist film in the photoresist film and does not cause a deterioration in a pattern shape such as a T-top, a round top and the like, which are caused by intermixing of a chemically amplified resist and a top antireflective film and inconvenient in an etching process.

Means for Solving the Problems

As a result of intensive studies and investigations, the present inventors found that, when resist pattern was formed on a chemically amplified photoresist film formed on a substrate by applying a composition for forming a top antireflective film containing a fluorine-containing compound, hydrophilizing the surface thereof and then exposing and developing, even if a dispense volume of the composition for forming an antireflective film was smaller than that of a conventional antireflective film, a uniform antireflective film having a predetermined film thickness could be formed on a substrate by adding a quaternary ammonium salt having a hydroxyl group or an alkanol group to the composition for forming an antireflective film, that is, the dispense with a smaller volume of a material could be performed and the present invention was achieved based on these findings.

That is, the invention relates to a composition for forming a top antireflective film, which is characterized by containing (A) at least one kind of fluorine-containing compound and (B) a quaternary ammonium compound represented by the formula (1):

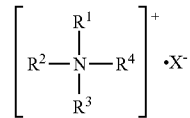

wherein at least one of $R^1$, $R^2$, $R^3$ and $R^4$ represents a hydroxyl group or an alkanol group, the others represent a hydrogen atom or an alkyl group having 1 to 10 carbon atoms, and $X^-$ represents a hydroxyl group, a halide ion or a sulfate ion.

The composition for forming a top antireflective film mentioned above may further contain a water-soluble polymer. Further, the composition for forming a top antireflective film preferably contains an acid (when the fluorine-containing compound and the water-soluble polymer are an acid, these are excluded from the acid defined here.), a surfactant and an aqueous solvent.

In addition, the invention relates to a method for forming a pattern, which is characterized by comprising a step of applying the aforementioned composition for forming a top antireflective film on a photoresist film and an optional step of heating.

Hereinafter, the present invention will be described in more detail.

As is described above, the composition for forming a top antireflective film of the invention contains a fluorine-containing compound and a quaternary ammonium compound represented by the formula (1) and optionally a water-soluble polymer, an acid, a surfactant, and an aqueous solvent. In what follows, the quaternary ammonium compound represented by the formula (1), which characterizes the invention, will be described in the first place.

The quaternary ammonium compound represented by the formula (1) described above is a compound in which at least one of $R^1$, $R^2$, $R^3$ and $R^4$ in the formula represents a hydroxyl group or an alkanol group, the others represent a hydrogen atom or an alkyl group having 1 to 10 carbon atoms, and $X^-$ represents an anion group such as a hydroxyl group, a halide ion or a sulfate ion. As the alkanol group, there is exemplified an alkanol group having 1 to 10 carbon atoms and a preferable alkanol group is an alkanol group having 1 to 3 carbon atoms. Further, as the alkyl group having 1 to 10 carbon atoms, an alkyl group having 1 to 3 carbon atoms is preferred. In the invention, application properties of the composition for forming a top antireflective film, that contains a fluorine-containing compound, are improved by the use of the quaternary ammonium compound represented by the formula (1) and thereby the application with a smaller amount of the composition can be performed.

Examples of the quaternary ammonium compound include N,N,N-trimethylhydroxyammonium hydroxide, N,N-dimethyldihydroxyammonium hydroxide, N-methyltrihydroxyammonium hydroxide, tetrahydroxyammonium hydroxide, N,N,N-trimethylmethanolammonium hydroxide, N,N-dimethyl-dimethanolammonium hydroxide, N-methyl-trimethanolammonium hydroxide, tetramethanolammonium hydroxide, N,N,N-trimethylethanolammonium hydroxide, N,N-dimethyl-diethanolammonium hydroxide, N-methyl-triethanolammonium hydroxide, tetraethanolammonium hydroxide, N,N,N-trimethylpropanolammonium hydroxide, N,N-dimethyl-dipropanolammonium hydroxide, N-methyltripropanolammonium hydroxide, tetrapropanolammonium hydroxide, and so on. These compounds are described only for illustration. Therefore, quaternary ammonium compounds used in the invention are not restricted to the illustrated quaternary ammonium compounds. When the composition for forming an antireflective film is used as a water solution or an aqueous solution, the amount of the quaternary ammonium compound used in the composition is 0.001% by weight to 5% by weight, preferably 0.005% by weight to 1% by weight, more preferably 0.01% by weight to 0.5% by weight.

The fluorine-containing compound used in the invention may be any one of fluorine-containing compounds as long as it is soluble in an aqueous solvent (as is described later, the aqueous solvent is a solution consisting of water or water and an organic solvent), that is, water-soluble. Any one of water-soluble fluorine-containing compounds so far used as a material constituting a top antireflective film may be used. Preferable examples of the fluorine-containing compounds include fluorinated compounds shown below.

(1) Perfluoroalkylcarboxylic acid having 4 to 15 carbon atoms,
(2) perfluoroalkylsulfonic acid having 4 to 10 carbon atoms,
(3) perfluoroadipic acid,
(4) perfluoroalkenyl ether sulfonic acid having 4 to 15 carbon atoms, and
(5) fluoroalkyl polyether sulfonic acid and fluoroalkyl polyether carboxylic acid represented by the following formulas:

$$R^{11}-(O-R^{12})_{n1}-SO_3H$$

$$HO_3S-(R^{13}-O)_{n2}-R^{14}-(O-R^{15})_{n3}-SO_3H$$

$$R^{16}-(O-R^{17})_{n4}-COOH$$

$$HOOC-(R^{18}-O)_{n5}-R^{19}-(O-R^{20})_{n6}-COOH$$

$$HOOC-(R^{21}-O)_{n7}-R^{22}(O-R^{23})_{n8}-SO_3H$$

In the formulas, $R^{11}$ and $R^{16}$ respectively represent an alkyl group, hydrogen atoms of which are partially or completely substituted by a fluorine atom or fluorine atoms, $R^{12}$ to $R^{15}$ and $R^{17}$ to $R^{23}$ respectively represent an alkylene group, hydrogen atoms of which are partially or completely substituted by a fluorine atom or fluorine atoms, a plurality of $R^{12}$, $R^{13}$, $R^{15}$, $R^{17}$, $R^{18}$, $R^{20}$, $R^{21}$ and $R^{23}$ respectively may be the same with or different from each other, $R^{13}$ and $R^{15}$, $R^{18}$ and $R^{20}$, and $R^{21}$ and $R^{23}$ respectively may be the same with or different from each other in the same molecule, and n1 to n8 respectively represent an integer of 1 or more.

Further, preferable examples of the fluoropolymer include:
(6) a fluoropolymer containing a polymer unit represented by the formula (2) shown below or a fluoropolymer containing a polymer unit represented by the formula (2) and a polymer unit represented by the formula (3).

$$-[CF_2CF(OR_fCOOH)]- \quad \text{Formula (2):}$$

wherein $R_f$ represents a linear or branched perfluoroalkylene group that may contain an ethereal oxygen atom.

$$-[CF_2CFX^1]- \quad \text{Formula (3):}$$

wherein $X^1$ represents a fluorine atom, a chlorine atom or a hydrogen atom.

In the repeating unit represented by the formula (2), the perfluoroalkylene group where $R_f$ contains 1 to 5 carbon atoms is preferred and in the repeating unit represented by the formula (3), a repeating unit where $X^1$ is a fluorine atom is preferred.

As the fluoropolymer containing a polymer unit represented by the formula (2) or the fluoropolymer containing a polymer unit represented by the formula (2) and a polymer unit represented by the formula (3), a fluoropolymer with a number average molecular weight of $1 \times 10^3$ to $3 \times 10^4$ as determined by polystyrene standards is preferred. In the invention, a fluorine-containing compound containing a carboxylic acid group or a sulfonic acid group in a molecule is used preferably as the fluorine-containing compound. Further, the fluorine-containing compound containing a carboxylic acid group or a sulfonic acid group in a molecule is preferably used in a state of acid but may be used as an ammonium salt or an organic amine salt. The examples mentioned above are shown only for illustration. Therefore, the fluorine-containing compound used in the invention is not restricted to the illustrated compounds.

These fluorine-containing compounds may be used singularly or in a combination of two or more thereof. The fluorine-containing compound may be used in an appropriate concentration by considering solubility thereof in an aqueous solvent, application properties of the composition, a film thickness to be formed, and the like. For example, when the fluorine-containing compound is a fluorinated compound such as perfluoroalkylsulfonic acid, perfluoroalkylcarboxylic acid or perfluoroadipic acid, an amount of the fluorine-containing compound in a composition for forming an antireflective film is preferably 0.1 to 25% by weight, more preferably 0.5 to 10% by weight, still more preferably 1 to 4% by weight. Further, when the fluorine-containing compound is a fluoropolymer, an amount of the fluoropolymer in a composition for forming an antireflective film is preferably 0.1 to 25% by weight, more preferably 0.5 to 10% by weight, still more preferably 1 to 4% by weight. An amount of the fluorine-containing compound is preferably 1 to 100 parts by weight, more preferably 5 to 80 parts by weight, relative to 1 part by weight of the quaternary ammonium compound represented by the formula (1). When the amount of the fluorine-containing compound is less than 1 part by weight, there is a problem that a decrease in a refractive index is insufficient and when it exceeds 100 parts by weight, there is a problem that an effect of lowering an application amount is weakened.

On the other hand, as the surfactant used as an additive in the composition for forming an antireflective film of the invention, there can be exemplified a nonionic surfactant, an anionic surfactant, an amphoteric surfactant and the like. Examples of the nonionic surfactant include polyoxyethylene alkyl ethers such as polyoxyethylene lauryl ether, polyoxyethylene oleyl ether and polyoxyethylene cetyl ether, a polyoxyethylene aliphatic acid diester, a polyoxyethylene aliphatic acid monoester, a polyoxyethylene-polyoxypropylene block polymer, and an acetylene glycol derivative. Examples of the anionic surfactant include an alkylsulfonic acid, an alkylbenzenesulfonic acid, an alkylcarboxylic acid and an ammonium salt or organic amine salt thereof, an alkylbenzenecarboxylic acid and an ammonium salt or organic amine salt thereof, or substances obtained by substituting all or a part of hydrogen atoms of the alkyl groups in these compounds with a fluorine atom or fluorine atoms, an alkyl diphenyl ether disulfonic acid and an ammonium salt or organic amine salt thereof, an alkyl diphenyl ether sulfonic acid and an ammonium salt or organic amine salt thereof, a polyoxyethylene alkyl ether sulfuric acid and an ammonium salt or organic amine salt thereof, and an alkylsulfuric acid and an ammonium salt or organic amine salt thereof. Examples of the amphoteric surfactant include 2-alkyl-N-carboxymethyl-N-hydroxyethylimidazolinium betaine and lauric amide propylhydroxysulfone betaine.

Among these surfactants, an alkylsulfonic acid, an alkylbenzenesulfonic acid, an alkylcarboxylic acid, an alkylbenzenecarboxylic acid, and compounds obtained by substituting all or a part of hydrogen atoms of the alkyl groups with a fluorine atom or fluorine atoms are preferred. Among these compounds, the compounds having an alkyl group with 1 to 20 carbon atoms are preferred. These surfactants are preferably used in an amount of 0.01% by weight to 2.0% by weight, more preferably 0.05% by weight to 1.0% by weight in a composition for forming an antireflective film. These surfactants may be used singularly or in a combination of two or more kinds thereof.

Further, the acid used in the composition for forming an antireflective film of the invention may be either an organic acid or an inorganic acid. Among these, the inorganic acid such as sulfuric acid, hydrochloric acid, nitric acid, phosphoric acid, hydrogen fluoride and hydrogen bromide is preferred. These acids are used in an amount of 0.01% by weight to 2.0% by weight in a composition for forming an antireflective film.

In the invention, when a photoresist is a positive-working chemically amplified photoresist, it is preferred that pH of the composition for forming an antireflective film is in an acidic range. That is, it is preferred that the pH of the composition for forming an antireflective film of the invention is 7 or less, more preferably in the range of 0.5 to 4.0, still more preferably in the range of 1.0 to 3.0. When the pH thereof is set in the above-mentioned state, there can be formed a resist pattern that does not have a deteriorated pattern shape such as a T-top or a round top which are caused by an intermixing between a chemically amplified resist and an antireflective film and are inconvenient in an etching step. When the composition for forming an antireflective film is applied to a positive-working chemically amplified photoresist, the ratio of the fluorine-containing compound, for example, a fluoropolymer to an acid or a surfactant is preferably from 1:0.01 to 1:0.5, more preferably from 1:0.01 to 1:0.3 by a weight ratio. At this time, when an acid is contained in a fluorine-containing compound or when an acid is contained in a water-soluble polymer, the ratio of the total mole number of acids of these fluoropolymer and the water-soluble polymer and an acid to be added or an acid of an surfactant to the mole number of a base of an alkanol group-containing quaternary ammonium salt is preferably in the range from 1:0.01 to 1:1.00, more preferably from 1:0.05 to 1:0.8, still more preferably from 1:0.05 to 1:0.2 and thereby the pH of the composition can be controlled within the aforementioned adequate range.

A water-soluble polymer may be added to the composition for forming an antireflective film of the invention within the range, where the performance of the composition is not impaired, in order to improve a film-forming property, as required. In particular, when a fluorinated compound is used as a fluorine-containing compound, it is usually necessary to use the water-soluble polymer from the viewpoint of a film-forming property. Examples of the water-soluble polymer used in the composition for forming an antireflective film of the invention include poly(vinylalcohol), poly(acrylic acid), poly(methacrylic acid), poly(α-trifluoromethylacrylic acid), poly(vinylpyrrolidone), vinylpyrrolidone copolymers such as poly(N-vinylpyrrolidone-co-vinylacetate), poly(N-vinylpyrrolidone-co-vinylalcohol), poly(N-vinylpyrrolidone-co-acrylic acid), poly(N-vinylpyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), poly(N-vinylpyrrolidone-co-itaconic acid), poly (N-vinylpyrrolidone-co-methyl itaconate) and poly(N-vinylpyrrolidone-co-itaconic anhydride), poly(vinyl methyl ether-co-maleic anhydride), poly(ethylene glycol-co-propylene glycol), fluorinated polyether, polyethylene oxide, amylose, dextran, cellulose, and pullulan. Among these, poly (acrylic acid), poly(vinylpyrrolidone), fluorinated polyether and the like are particularly preferred. In addition, these specific examples are described only for illustration. Therefore, the water-soluble polymer used in the invention is not restricted to these water-soluble polymers. Further, a preferable amount of the water-soluble polymer is different by a polymer to be used. When a fluorinated compound is used, the amount of the water-soluble polymer used in a composition for forming an antireflective film is generally 0.05 to 10% by weight, preferably 0.1 to 2% by weight and when a fluoropolymer is used, the total amount of the water-soluble polymer and the fluoropolymer in the composition is generally 0.05 to 10% by weight, preferably 0.1 to 2% by weight.

Furthermore, as the aqueous solvent used in the composition for forming an antireflective film of the invention, water or a homogeneous liquid mixture of water and a water-soluble organic solvent can be cited. As the aqueous solvent, water is usually used. As water used in the composition for forming an antireflective film of the invention, water from which organic impurities, metallic ions and the like are removed by a distillation, an ion exchange treatment, a filter treatment or various kinds of adsorption treatments is preferred.

In order to improve coating properties of the composition further, a water-soluble organic solvent may be used together with water. The water-soluble organic solvent used is not particularly restricted as long as it is soluble in water in an amount of 0.1% by weight or more. Examples thereof include alcohols such as methyl alcohol, ethyl alcohol, and isopropyl alcohol; ketones such as acetone and methyl ethyl ketone; esters such as methyl acetate, ethyl acetate and ethyl lactate; polar solvents such as dimethyl formamide, dimethylsulfoxide, methyl cellosolve, cellosolve, butyl cellosolve, cellosolve acetate, alkyl cellosolve acetate, butyl carbitol, and carbitol acetate. In addition, these specific examples are cited only for illustration. Therefore, the organic solvent used in the invention is not restricted to these solvents.

In a method for forming a pattern according to the invention, the composition for forming a top antireflective film of the invention is applied on a photoresist film at a predetermined thickness to form a top antireflective film. The photoresist on which the composition for forming a top antireflective film of the invention is applied may be any one of so far known photoresists and either a positive-working resist or a negative-working resist may be used. A positive-working chemically amplified photoresist is preferably used in the invention as the photoresist.

The positive-working chemically amplified photoresist used in the method for forming a pattern according to the invention may be any one of so far known positive-working chemically amplified photoresists. As the positive-working chemically amplified photoresists, there are known various kinds of photoresists including a photoresist comprising a polymer, in which polyhydroxy styrene is protected with t-butoxycarbonyl group, and a photoacid generator (H. Ito, C. G. Willson: Polym. Eng. Sci., 23, 1012 (1983)), a photoresist comprising triphenyl sulfonium/hexafluoroarsenate and poly (p-tert-butoxycarbonyloxy-α-methylstyrene) described in JP-A No. 2-27660 and the like and any one thereof can be used in the invention. Further, a film thickness of the photoresist may be any one as long as the resist pattern obtained after development can be suitably adapted in an etching step and it is generally about 0.3 to 1.0 μm.

The method for forming a pattern according to the invention is the same as a conventional method for forming a resist pattern except that the composition for forming an antireflective film of the invention is applied and then a heating step is optionally added. Hereinafter, a case where a positive-working chemically amplified photoresist is used as a photoresist will be taken as an example for an explanation of the method. In this case, a photoresist is applied on a substrate such as a silicon wafer and the like, followed by optional pre-baking (for example, baking at 70 to 150° C. for about 1 minute) to form a photoresist film on the substrate. Then, a composition for forming a top antireflective film of the invention is applied on the photoresist film so as to become an optimum film thickness and is optionally heated to form a top antireflective film. After exposure thereof with a reduction projection exposure device such as STEPPER (registered trade mark), a post-exposure bake (PEB) is optionally conducted at a baking temperature of, for example, 50 to 150° C. and a development is conducted. Then, a baking after development is optionally conducted (for example, at a baking temperature of 60 to 120° C.) and thereby a positive resist pattern is formed.

The optimum film thickness of the composition for forming a top antireflective film of the invention after application can be calculated corresponding to an exposure wavelength by the following numerical formula:

Optimum film thickness=$\lambda/4n$ wherein $\lambda$ represents an exposure wavelength and n represents a refractive index of an antireflective film at an exposure wavelength.

As the optimum film thickness, a value calculated by the aforementioned numerical formula in itself may be used and an odd multiple value thereof may be used. Further, the composition for forming a top antireflective film can be applied by so far known optional methods such as a spin coating method.

The method for forming a pattern according to the invention can be suitably applied irrespective of an inch size of a substrate, that is, even when a pattern is formed on a large diameter substrate such as 8 inch, 12 inch or more. A silicon substrate is generally used as a substrate. However, a substrate having a film such as a metal film or an oxide or nitride film such as silicon oxide, silicon nitride and silicon oxynitride or the like on a silicon substrate can be of course used. Further, a substrate material may be any one of substrate materials that have been conventionally used for production of ICs such as LSIs without restricting to silicon.

A photoresist coating method, a baking method of a photoresist film and a film formed by a composition for forming an antireflective film, an exposure method, a developing agent, a developing method and the like may be any one of methods and conditions that have been conventionally used when a resist pattern was formed with a photoresist. Furthermore, an exposure light source used in an exposure step also may be any one of UV-rays, far ultraviolet rays, X-rays and electron beams.

EXAMPLES

Hereinafter, the invention will be specifically described with reference to Examples. However, the present invention is not restricted to these descriptions.

Example 1

An aqueous solution of N,N,N-trimethylethanolammonium hydroxide as a quaternary ammonium compound containing an alkanol group and an aqueous solution of a fluoropolymer (weight average molecular weight of 6,200 as determined by polystyrene standards) having a repeating unit represented by the following formula (4) as a polymer were prepared and mixed so that a molar ratio of an acid of the fluoropolymer to a base became 1:0.1.

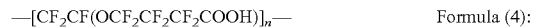

—[CF$_2$CF(OCF$_2$CF$_2$CF$_2$COOH)]$_n$—            Formula (4):

Then, 2.1 parts by weight on a dry basis of an aqueous solution of a partial N,N,N-trimethylethanol ammonium salt, of the fluoropolymer represented by the formula (4), which was obtained above, 0.1 parts by weight on a dry basis of an aqueous solution of an alkylsulfonic acid (wherein the alky group is a mixture of alkyl groups having 10 to 18 carbon atoms) and 97.8 parts by weight as a total weight of pure water were mixed and dissolved homogeneously at room temperature, followed by filtering through a 0.03 μm high-density polyethylene filter, and thereby a composition for forming an antireflective film was obtained. PH of the composition was 1.6.

A positive-working photoresist made of an ESCAP (Environmental Stable Chemically Amplified Photoresist) polymer, AZ DNC-5 (trade name, manufactured by AZ Electronic Materials (Japan) K. K., "AZ" is a registered trade mark) was applied on a silicon wafer using a spin coater MARK 8 (trade name, manufactured by Tokyo Electron Ltd.) and then pre-baked on a hot plate at 130° C. for 60 seconds to form a resist film having a thickness of 800 nm on the silicon wafer. The film thickness was measured with a film thickness measuring device SM300 (trade name, manufactured by Prometric Inc.). Subsequently, the composition for forming an antireflective film was applied on the photoresist film using the same spin coater as that mentioned above and pre-baked on a hot plate at 90° C. for 60 seconds to form an antireflective film having a film thickness of 450 Å on the photoresist film. At this time, the composition for forming an antireflective film was dispensed on the silicon wafer using a dispenser and the minimum dispense volume, which is a minimum amount by which the applied composition can reach to an edge portion of the wafer and an even coating can be formed, was determined by eyes. The result is shown in Table 1.

Example 2

An aqueous solution of N,N,N-trimethylethanol ammonium hydroxide as a quaternary ammonium compound containing an alkanol group and an aqueous solution of perfluorooctanesulfonic acid as a fluorinated compound were prepared and mixed so that a molar ratio of an acid to a base became 1:0.4. Further, polyvinyl pyrrolidone was used as a water-soluble polymer. 2.8 parts by weight on a dry basis of an aqueous solution of a partial N,N,N-trimethylethanolammonium salt of perfluorooctanesulfonic acid obtained above, 0.7 parts by weight of polyvinyl pyrrolidone and 96.5 parts by weight of pure water as a total amount were mixed and dissolved homogeneously at room temperature, followed by filtering through a 0.03 μm high-density polyethylene filter to form a composition for forming an antireflective film. Subsequently, an antireflective film having a film thickness of 450 Å was formed on a photoresist film in the same manner as EXAMPLE 1 and at that time, a minimum dispense volume thereof was measured in the same manner as EXAMPLE 1. The result is shown in Table 1.

Example 3

A minimum dispense volume of a composition for forming an antireflective film was measured in the same manner as EXAMPLE 2 except that the water-soluble polymer in EXAMPLE 2 was changed to poly(acrylic acid). The result is shown in Table 1.

Example 4

A minimum dispense volume of a composition for forming an antireflective film was measured in the same manner as EXAMPLE 2 except that the fluorinated compound in EXAMPLE 2 was changed to 3,3,4,4,5,5,6,6,7,7,8,8,9,9,10,10,10-heptadecafluoro-1-decanesulfonic acid. The result is shown in Table 1.

Example 5

A minimum dispense volume of a composition for forming an antireflective film was measured in the same manner as EXAMPLE 4 except that the water-soluble polymer in EXAMPLE 4 was changed to poly(acrylic acid). The result is shown in Table 1.

TABLE 1

|  | Minimum dispense volume |
| --- | --- |
| Example 1 | 1.5 ml |
| Example 2 | 1.5 ml |
| Example 3 | 1.5 ml |
| Example 4 | 2.0 ml |
| Example 5 | 2.0 ml |

Comparative Example 1

A minimum dispense volume of a composition for forming an antireflective film was measured in the same manner as EXAMPLE 1 except that N,N,N-trimethylethanolammonium hydroxide used in EXAMPLE 1 was changed to monoethanolamine. The result is shown in Table 2.

Comparative Example 2

When tetramethylammonium hydroxide was used in place of N,N,N-trimethylethanol ammonium hydroxide in EXAMPLE 1, a chemical precipitated.

Comparative Example 3

A minimum dispense volume of a composition for forming an antireflective film was measured in the same manner as EXAMPLE 2 except that N,N,N-trimethylethanolammonium hydroxide used in EXAMPLE 2 was changed to monoethanolamine. The result is shown in Table 2.

Comparative Example 4

A minimum dispense volume of a composition for forming an antireflective film was measured in the same manner as EXAMPLE 2 except that N,N,N-trimethylethanolammonium hydroxide used in EXAMPLE 2 was changed to tetramethylammonium hydroxide. The result is shown in Table 2.

Comparative Example 5

A minimum dispense volume of a composition for forming an antireflective film was measured in the same manner as EXAMPLE 3 except that N,N,N-trimethylethanolammonium hydroxide used in EXAMPLE 3 was changed to monoethanolamine. The result is shown in Table 2.

Comparative Example 6

A minimum dispense volume of a composition for forming an antireflective film was measured in the same manner as EXAMPLE 3 except that N,N,N-trimethylethanolammonium hydroxide used in EXAMPLE 3 was changed to tetramethylammonium hydroxide. The result is shown in Table 2.

Comparative Example 7

When monoethanolamine was used in place of N,N,N-trimethylethanolammonium hydroxide in EXAMPLE 4, a chemical precipitated.

Comparative Example 8

A minimum dispense volume of a composition for forming an antireflective film was measured in the same manner as EXAMPLE 4 except that N,N,N-trimethylethanolammonium hydroxide used in EXAMPLE 4 was changed to tetramethylammonium hydroxide. The result is shown in Table 2.

Comparative Example 9

When monoethanolamine was used in place of N,N,N-trimethylethanol ammonium hydroxide in EXAMPLE 5, a chemical precipitated.

Comparative Example 10

A minimum dispense volume of a composition for forming an antireflective film was measured in the same manner as EXAMPLE except that N,N,N-trimethylethanolammonium hydroxide used in EXAMPLE 5 was changed to tetramethylammonium hydroxide. The result is shown in Table 2.

TABLE 2

|  | Minimum dispense volume |
| --- | --- |
| Comparative Example 1 | 2.5 ml |
| Comparative Example 2 | Milky solution |
| Comparative Example 3 | 2.5 ml |
| Comparative Example 4 | 2.5 ml |
| Comparative Example 5 | 2.5 ml |
| Comparative Example 6 | 2.5 ml |
| Comparative Example 7 | Milky solution |
| Comparative Example 8 | 3.0 ml |
| Comparative Example 9 | Milky solution |
| Comparative Example 10 | 3.0 ml |

Comparative Examples 11 to 18

A polymer (a fluoropolymer or a water-soluble polymer), a fluorinated compound, a surfactant and an amine, which are shown in Table 3 below, were respectively used as an aqueous solution and in an amount on a dry basis (all are by % by weight) shown in Table 3. Water was further used so as to be finally 100% by weight in total together with the solid contents and compositions for forming a top antireflective film were prepared. After this, minimum dispense volume of the compositions for forming an antireflective film were measured in the same manner as EXAMPLE 1.

In Table 3, the fluoropolymer is a fluoropolymer used in EXAMPLE 1, the alkylsulfonic acid is a mixture of alkylsulfonic acids in which an alkyl group has 10 to 18 carbon atoms and the fluorine-containing sulfonic acid is 3,3,4,4,5,5,6,6,7,7,8,8,9,9,10,10,10-heptadecafluoro-1-decanesulfonic acid.

TABLE 3

|  | Water-soluble polymer Fluoropolymer | Fluorinated compound Surfactant | Amine | Minimum dispense volume |
|---|---|---|---|---|
| Comparative Example 11 | fluoropolymer 2.04 | alkylsulfonic acid 0.1 | triethanolamine 0.1 | 3.0 ml |
| Comparative Example 12 | fluoropolymer 2.04 | alkylsulfonic acid 0.1 | diethanolamine 0.07 | 3.0 ml |
| Comparative Example 13 | polyvinyl pyrrolidone 0.61 | perfluorooctane sulfonic acid 2.14 | triethanolamine 0.25 | 3.0 ml |
| Comparative Example 14 | polyvinyl pyrrolidone 0.63 | perfluorooctane sulfonic acid 2.19 | diethanolamine 0.18 | 3.0 ml |
| Comparative Example 15 | polyvinyl pyrrolidone 0.63 | perfluorooctane sulfonic acid 2.2 | triethanolamine 0.18 | 3.0 ml |
| Comparative Example 16 | polyvinyl pyrrolidone 0.61 | fluorine-containing sulfonic acid 2.14 | triethanolamine 0.25 | 3.0 ml |
| Comparative Example 17 | polyvinyl pyrrolidone 0.63 | fluorine-containing sulfonic acid 2.2 | diethanolamine 0.18 | 3.0 ml |
| Comparative Example 18 | polyvinyl pyrrolidone 0.61 | fluorine-containing sulfonic acid 2.2 | triethanolamine 0.18 | 3.0 ml |

As is obvious from Tables 1 and 2, when an alkanol group is contained in a quaternary ammonium compound, an application amount of the composition can be reduced. The reason is considered that, when a hydroxyl group or an alkanol is contained in a quaternary ammonium compound, solubility in water of the resulting quaternary ammonium salt is improved. Further, from Table 3, it is found that when diethanolamine or triethanolamine is used as an amine, the minimum dispense volume of the composition is larger than that of the invention in spite of the kinds of a fluorine-containing compound, a water-soluble polymer and a surfactant used.

Example 6

An aqueous composition for a top antireflective film having a total solid content of 3% by weight was prepared by use of 300 parts by weight on a dry basis of an aqueous solution of a fluoropolymer used in EXAMPLE 1 with respect to 100 parts by weight on a dry basis of an aqueous N,N,N-trimethylethanolammonium hydroxide solution. The composition was applied on a silicon wafer using a spin coater, followed by measuring a refractive index of the coated film to each of an i-line (365 nm), a KrF excimer laser (248 nm) and an ArF excimer laser (193 nm). Results are shown in Table 4 shown below.

Example 7

An aqueous composition for a top antireflective film having a total solid content of 2.2% by weight was prepared by use of 950 parts by weight on a dry basis of an aqueous solution of a fluoropolymer used in EXAMPLE 1 and 50 parts by weight on a dry basis of an aqueous solution of an alkylsulfonic acid used in EXAMPLE 2 with respect to 100 parts by weight on a dry basis of an aqueous N,N,N-trimethylethanolammonium hydroxide solution. Refractive indexes of the coated film to each of an i-line (365 nm), a KrF excimer laser (248 nm) and an ArF excimer laser (193 nm) were measured in the same manner as EXAMPLE 6. Results are shown in Table 4 below.

Comparative Example 19

An aqueous composition for a top antireflective film having a total solid content of 3% by weight was prepared by use of 3 parts by weight on a dry basis of an aqueous solution of a fluoropolymer used in EXAMPLE 1 with respect to 100 parts by weight on a dry basis of an aqueous N,N,N-trimethylethanolammonium hydroxide solution. Refractive indexes of the coated film to each of an i-line (365 nm), a KrF excimer laser (248 nm) and an ArF excimer laser (193 nm) were measured in the same manner as EXAMPLE 6. Results are shown in Table 4 below.

TABLE 4

|  | Wavelength | Refractive index |
|---|---|---|
| Example 6 | 193 nm | 1.5502 |
|  | 248 nm | 1.4639 |
|  | 365 nm | 1.4394 |
| Example 7 | 193 nm | 1.4797 |
|  | 248 nm | 1.4309 |
|  | 365 nm | 1.3854 |
| Comparative Example 19 | 193 nm | 1.6927 |
|  | 248 nm | 1.5782 |
|  | 365 nm | 1.5224 |

From Table 4, it is found that when the amount of N,N,N-trimethylethanolammonium hydroxide is excessive to the amount of a fluoropolymer and the pH of the liquid becomes 7 or more, the refractive indexes are not within a preferable range as an antireflective film.

ADVANTAGEOUS EFFECTS OF THE INVENTION

As is described in detail above, a lowering of an application amount of a composition can be realized by containing a quaternary ammonium compound having a hydroxyl group or an alkanol group in a composition for forming a top antireflective film containing a fluorine-containing compound, and a lowering of an amount of a waste liquid, to which attention is paid in recent semiconductor industries from the viewpoint of an influence on an environment, can be realized by the reduction of an application amount of a chemical solution material.

The invention claimed is:

1. A composition for forming a top antireflective film, which comprises
   (A) at least one of fluorine-containing compounds wherein the fluorine-containing compound is a is a fluoropolymer containing a polymer unit represented by the formula (2) or a fluoropolymer containing a polymer unit represented by the formula (2) and a polymer unit represented by the formula (3):

—[CF$_2$CF(OR$_f$COOH)]—  Formula (2)

wherein R$_f$ represents a linear or branched perfluoroalkylene group that may contain an ethereal oxygen atom;

—[CF$_2$CFX$^1$]—  Formula (3)

wherein X$^1$ represents a fluorine atom, a chlorine atom or a hydrogen atom; and
   (B) a quaternary ammonium compound represented by the formula (1):

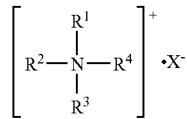

wherein at least one of R$^1$, R$^2$, R$^3$ and R$^4$ represents a hydroxyl group or an alkanol group, the others represent a hydrogen atom or an alkyl group having 1 to 10 carbon atoms, and X$^-$ represents a hydroxyl group wherein the ratio of moles of acid from the fluoropolymer to the number of moles of base from the quaternary ammonium compound is in the range of 1:0.01 to 1:1.00 and wherein a lowering of an application amount of the composition can be realized.

2. The composition for forming a top antireflective film according to claim 1, wherein at least one of R$^1$, R$^2$, R$^3$ and R$^4$ in the quaternary ammonium compound represented by the formula (1) is a hydroxyethylene group.

3. The composition for forming a top antireflective film according to claim 1, wherein the composition further comprises a fluorine-containing compound selected from a perfluoroalkylsulfonic acid, a perfluoroalkylcarboxylic acid, and perfluoroadipic acid.

4. The composition for forming a top antireflective film according to claim 1, which further comprises a water-soluble polymer.

5. The composition for forming a top antireflective film according to claim 1, which further comprises an aqueous solvent and an acid or a surfactant.

6. The composition for forming a top antireflective film according to claim 5, wherein the acid is sulfuric acid, hydrochloric acid, nitric acid, phosphoric acid, hydrogen fluoride or hydrogen bromide and the surfactant is an alkylsulfonic acid, an alkylbenzenesulfonic acid, an alkylcarboxylic acid, an alkylbenzenecarboxylic acid or compounds in which all or a part of hydrogen atoms of the alkyl group in the acids are substituted by a fluorine atom or fluorine atoms.

7. The composition for forming a top antireflective film according to claim 5, wherein the aqueous solvent is water.

8. A method for forming a pattern which comprises steps; applying the composition for forming an antireflective film according to claim 1 and, wherein a lowering of an application amount of the composition can be realized.

* * * * *